US008810009B2

(12) United States Patent
Li et al.

(10) Patent No.: US 8,810,009 B2
(45) Date of Patent: Aug. 19, 2014

(54) METHOD OF FABRICATING A PLANAR SEMICONDUCTOR NANOWIRE

(75) Inventors: Xiuling Li, Champaign, IL (US); Seth A. Fortuna, Berkeley, CA (US)

(73) Assignee: The Board of Trustees of the University of Illinois, Urbana, IL (US)

( * ) Notice: Subject to any disclaimer, the term of this patent is extended or adjusted under 35 U.S.C. 154(b) by 620 days.

(21) Appl. No.: 12/989,558

(22) PCT Filed: Apr. 24, 2009

(86) PCT No.: PCT/US2009/041639
§ 371 (c)(1),
(2), (4) Date: Dec. 30, 2010

(87) PCT Pub. No.: WO2009/134687
PCT Pub. Date: Nov. 5, 2009

(65) Prior Publication Data
US 2011/0121434 A1   May 26, 2011

Related U.S. Application Data

(60) Provisional application No. 61/048,207, filed on Apr. 27, 2008.

(51) Int. Cl.
*H01L 29/04* (2006.01)
*H01L 21/02* (2006.01)

(52) U.S. Cl.
CPC .... *H01L 21/02521* (2013.01); *H01L 21/02664* (2013.01); *H01L 21/02463* (2013.01); *H01L 21/02653* (2013.01); *H01L 21/02645* (2013.01); *H01L 21/02603* (2013.01); *H01L 21/02433* (2013.01); *H01L 21/02576* (2013.01); *H01L 21/0237* (2013.01); *H01L 21/02546* (2013.01); *H01L 21/0262* (2013.01); *H01L 21/02395* (2013.01); *Y10S 977/762* (2013.01); *Y10S 977/938* (2013.01)
USPC ............ 257/627; 257/E29.003; 257/E29.004; 977/762; 977/938

(58) Field of Classification Search
USPC ........... 257/627, E21.461, E29.003, E29.004, 257/E29.168, E29.245, E51.04; 977/938, 977/762
See application file for complete search history.

(56) References Cited

U.S. PATENT DOCUMENTS 7,339,184 B2    3/2008   Romano et al.
7,560,366 B1 *  7/2009   Romano et al. ............... 438/503
(Continued)

FOREIGN PATENT DOCUMENTS

WO    WO 2006/110163 A2    10/2006
WO    WO 2009005261 A2 *  1/2009

OTHER PUBLICATIONS

Ghosh, S.C.; Kruse, P.; LaPierre, R.R. "The Effect of GaAs(100) Surface Preparation on the Growth of Nanowires," *Nanotechnology*, 2009, 20, 115602 (7 pages).

(Continued)

*Primary Examiner* — Benjamin Sandvik
*Assistant Examiner* — Leslie Pilar Cruz
(74) *Attorney, Agent, or Firm* — Brinks Gilson & Lione

(57) ABSTRACT

A composition comprises a semiconductor substrate having a crystallographic plane oriented parallel to a surface of the substrate and at least one planar semiconductor nanowire epitaxially disposed on the substrate, where the nanowire is aligned along a crystallographic direction of the substrate parallel to the crystallographic plane. To fabricate a planar semiconductor nanowire, at least one nanoparticle is provided on a semiconductor substrate having a crystallographic plane oriented parallel to a surface of the substrate. The semiconductor substrate is heated within a first temperature window in a processing unit. Semiconductor precursors are added to the processing unit, and a planar semiconductor nanowire is grown from the nanoparticle on the substrate within a second temperature window. The planar semiconductor nanowire grows in a crystallographic direction of the substrate parallel to the crystallographic plane.

41 Claims, 15 Drawing Sheets

(56) References Cited

U.S. PATENT DOCUMENTS

| | | | |
|---|---|---|---|
| 2003/0008505 A1* | 1/2003 | Chen et al. | 438/689 |
| 2005/0179086 A1* | 8/2005 | Voutsas et al. | 257/347 |
| 2006/0286782 A1 | 12/2006 | Gaska et al. | |
| 2007/0017439 A1 | 1/2007 | Xianyu et al. | |
| 2007/0032051 A1* | 2/2007 | Lieber et al. | 438/497 |
| 2007/0252132 A1* | 11/2007 | Kamins et al. | 257/13 |
| 2009/0075035 A1* | 3/2009 | O'Brien et al. | 428/195.1 |
| 2010/0029063 A1* | 2/2010 | Gambin et al. | 438/478 |

OTHER PUBLICATIONS

Mattila, M.; Hakkarainen, T.; Jiang, H.; Kauppinen, E.I.; Lipsanen, H. "Effect of Substrate Orientation on the Catalyst-Free Growth of InP Nanowires," *Nanotechnology*, 2007, 18, 155301 (5 pages).

Mikkelsen, A.; Eriksson, J.; Lundgren, E.; Andersen, J.N.; Weissenrieder, J.; Seifert, W. "The Influence of Lysine on InP(001) Surface Ordering and Nanowire Growth," *Nanotechnology*, 2005, 16, 2354-2359.

Mikkelsen, A.; Sköld, N.; Ouattara, L.; Lundgren, E. "Nanowire Growth and Dopants Studied by Cross-Sectional Scanning Tunnelling Microscopy," *Nanotechnology*, 2006, 17, S362-S368.

Nikoobakht, B. "Toward Industrial-Scale Fabrication of Nanowire-Based Devices," *Chem. Mater.*, 2007, 19, 5279-5284.

Nikoobakht, B.; Michaels, C.A.; Stranick, S.J.; Vaudin, M.D. "Horizontal Growth and in situ Assembly of Oriented Zinc Oxide Nanowires," *Applied Physics Letters*, 2004, 85, 15, 3244-3246.

Ouattara, L.; Mikkelsen, A.; Sköld, N.; Eriksson, J.; Knaapen, T.; Cavar, E.; Seifert, W.; Samuelson, L.; Lundgren, E. "GaAs/AlGaAs Nanowire Heterostructures Studied by Scanning Tunneling Microscopy," *Nano Lett.*, 2007, 7, 9 2859-2864.

Seifert, W.; Borgström, M.; Deppert, K.; Dick, K.A.; Johansson, J.; Larsson, M.W.; Martensson, T.; Sköld, N.; Svensson, P.T.; Wacaser, B.A.; Wallenberg, L.R.; Samuelson, L. "Growth of One-Dimensional Nanostructures in MOVPE," *J. Crystal Growth*, 2004, 272, 211-220.

Zhang, G.; Tateno, K.; Gotoh, H.; Nakano, H. "Parallel-Aligned GaAs Nanowires With <110> Orientation Laterally Grown on [311]B Substrates Via the Gold-Catalyzed Vapor-Liquid-Solid Mode," *Nanotechnology*, 2010, 21, 095607, (10 pages).

Zhang, X.; Zou, J.; Paladugu, M.; Guo, Y.; Wang, Y.; Kim, Y.; Joyce, H.J.; Gao, Q.; Tan, H.H.; Jagadish, C. "Evolution of Epitaxial InAs Nanowires on GaAs (111)B," *Small*, 2009, 5, 3, 366-369.

Zhang, Z.; Wong, L.M.; Wang, H.X.; Wei, Z.P.; Zhou, W.; Wang, S.J.; Wu, T. "Self-Assembled In-Plane Growth of $Mg_2SiO_4$ Nanowires on Si Substrates Catalyzed by Au Nanoparticles," *Adv. Funct. Mater.*, 2010, 20, 2511-2518.

\* cited by examiner

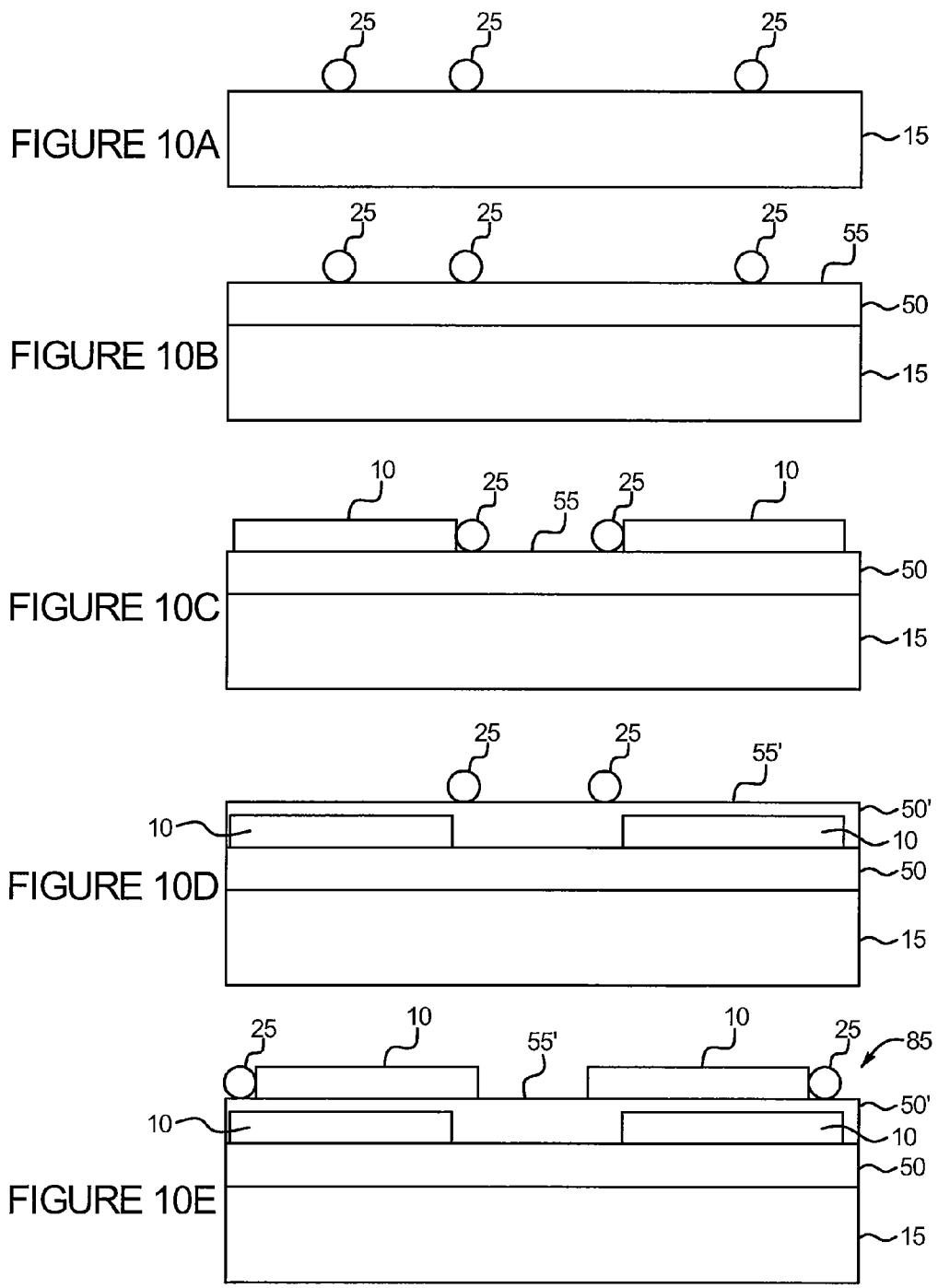

METHOD OF FABRICATING A PLANAR SEMICONDUCTOR NANOWIRE

RELATED APPLICATION

The present patent document is the National Stage of International Application No. PCT/US2009/041639, filed Apr. 24, 2009, which claims the benefit of the filing date under 35 U.S.C. §119(e) of U.S. Provisional Patent Application Ser. No. 61/048,207, which was filed on Apr. 27, 2008, which is hereby incorporated by reference in its entirety.

TECHNICAL FIELD

The present disclosure is related generally to nanostructured materials and more particularly to semiconductor nanowires.

BACKGROUND

Interest in semiconductor nanowires has increased over the past several years in part because of their unique optical and electrical properties and the capability of producing high quality heterostructures with large lattice mismatch on the nanometer scale. In addition, potential applications for nanowires in miniaturization of electronics and photonics has piqued interest. However, integration of semiconductor nanowire based devices has been problematic and usually requires the technologically disadvantageous (111) substrate for vertical nanowire devices or ex-situ assembly techniques to coarsely align planar nanowire devices.

One method of achieving horizontal fabrication of nanowires (in-plane with the substrate) utilizes the growth of nanowires between two parallel surfaces etched or selectively grown on a substrate resulting in a bridged nanowire structure. Spatially controlled catalyst patterning on such a surface is difficult due to the three-dimensional geometry which limits the scalability of such structures. In addition, alignment between adjacent nanowires is imperfect and difficult to control.

Nanowire growth in a direction other than the widely established <111> direction has also been previously observed. However, in general, the demonstrated yield of such nanowires is low and not easily controlled through growth conditions.

BRIEF SUMMARY

A controlled method for fabricating one or more planar semiconductor nanowires on a substrate is described herein, as well as a composition comprising the nanowires. An array of self-aligned planar semiconductor nanowires may be grown on a substrate using an embodiment of the present method. The planar semiconductor nanowires may be released from the substrate and transferred to another substrate without substantially disturbing their alignment, according to another embodiment. A vertical stack of planar semiconductor nanowires may be fabricated, as well as planar nanowire-based electronic or optoelectronic devices, by exploiting the present composition and method.

The composition includes a semiconductor substrate having a crystallographic plane oriented parallel to a surface of the substrate, and at least one planar semiconductor nanowire epitaxially disposed on the substrate, where the nanowire is aligned along a crystallographic direction of the substrate parallel to the crystallographic plane.

To fabricate a planar semiconductor nanowire, according to one embodiment, at least one nanoparticle is provided on a semiconductor substrate, where the substrate has a crystallographic plane oriented parallel to a surface thereof. The semiconductor substrate is heated within a first temperature window in a processing unit. Semiconductor precursors are added to the processing unit, and a planar semiconductor nanowire is grown from the nanoparticle on the substrate within a second temperature window. The planar semiconductor nanowire grows in a crystallographic direction of the substrate parallel to the crystallographic plane.

To manufacture a planar semiconductor nanowire, according to another embodiment, a nanoparticle is deposited on a substrate, and the substrate is annealed in a MOCVD reactor in a first temperature window. Semiconductor precursors are added to the MOCVD reactor, and at least one planar semiconductor nanowire grows on the substrate from the nanoparticle in a second temperature window.

To manufacture detachable planar semiconductor nanowires, according to one embodiment, a nanoparticle catalyst is deposited on a substrate, and the substrate is annealed in a MOCVD reactor in a first temperature window. Semiconductor precursors are added to the MOCVD reactor, and an epitaxial sacrificial layer is deposited on the substrate in a second temperature window, where the nanoparticle catalyst is elevated to the surface and the epitaxial layer is between the nanoparticle and the substrate. Planar semiconductor nanowires grow on the sacrificial layer in a third temperature window, and the epitaxial sacrificial layer is removed to release the planar semiconductor nanowires from the substrate.

BRIEF DESCRIPTION OF THE DRAWINGS

(FIGS. 2A-2B) and at 475° C. (FIG. 2C), and the samples were tilted 75° to obtain the images of FIGS. 2B and 2C;

FIG. 4A shows predominantly <111> nanowires grown at 420° C., FIG. 4B shows tapered, aligned planar nanowires grown at 520° C., and inset shows a high-magnification SEM image of a tapered planar nanowire viewed along its growth axis;

FIGS. 10A-10E show a cross-sectional view of a process to form a vertical stack of planar nanowires;

DETAILED DESCRIPTION

The present disclosure provides a controlled method of growing GaAs and other semiconductor planar nanowires that self-align on (100) substrates using a metalorganic chemical vapor deposition (MOCVD) reactor with a metal catalyst; and releasing these nanowires controllably for transfer printing. Methods for nanowire integration and planar nanowire-based electronic and optoelectronic devices are also provided.

Planar, as used herein, refers to a nanowire that is epitaxially attached to a substrate in the axial direction and aligns along substrate crystallographic directions during growth. The nanowire may be epitaxially attached to the substrate or to an intermediate layer between the nanowire and the substrate. A nanowire (or layer) that is "epitaxially attached to" or "epitaxially disposed on" a substrate (or other layer) has crystallographic characteristics, such as crystal lattice structure and orientation, mirroring those of the underlying substrate or layer. This is due to a substantial degree of lattice matching at the interface between the nanowire and the substrate, which is characteristic of an epitaxial relationship. Such a nanowire (or layer) may be described as an "epitaxial nanowire" (or "epitaxial layer"). A nanowire or layer that is described herein as growing epitaxially on a substrate or other layer is understood to be formed with crystallographic characteristics mirroring those of the underlying substrate or layer.

Also, as would be understood by one of ordinary skill in the art, (hkl) notation is used herein in reference to a crystallographic plane of a particular orientation from the {hkl} family of crystallographically equivalent planes. Similarly, [hkl] notation is used in reference to a particular crystallographic direction, and <hkl> notation is used in reference to one or more crystallographically equivalent directions. For example, the (100) plane and the (001) plane are part of the {100} family of planes for crystals with cubic symmetry, and [01-1] and [0-11] are particular <110> directions. As used herein, the term "(hkl) substrate" or "hkl layer" refers to a substrate or layer having its (hkl) crystallographic planes oriented parallel to a surface of the substrate or layer. For example, a (100) substrate has its (100) crystallographic planes oriented parallel to the surface.

Figure 1A:
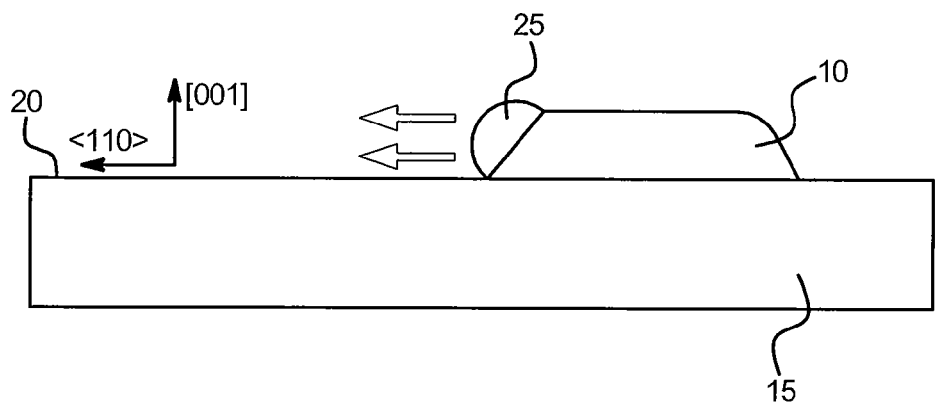
FIGS. 1A and 1B are schematics showing growth of a planar semiconductor nanowire on a semiconductor substrate.
Figure 1B:
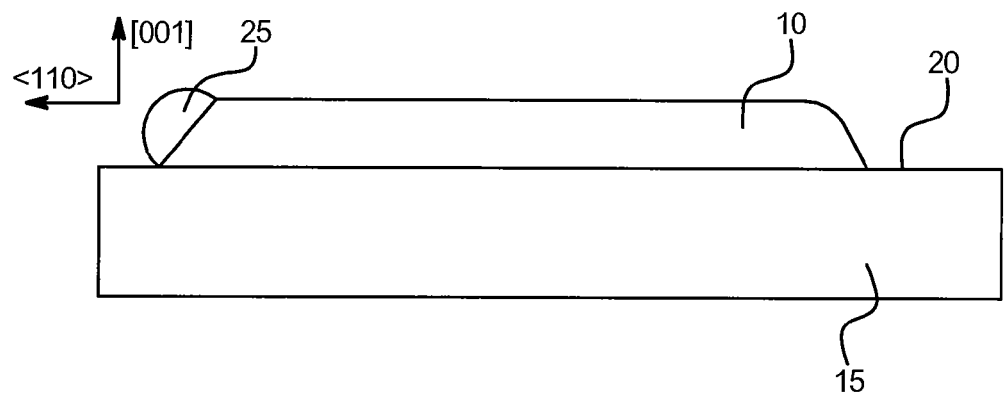

FIGS. 1A and 1B are schematics showing growth of a planar semiconductor nanowire 10 on a (001) semiconductor substrate 15, according to one embodiment. A metal nanoparticle 25 that acts as a catalyst for growth of the planar semiconductor nanowire 10 is in contact with an end of the nanowire 10. The planar semiconductor nanowire 10 grows epitaxially on the substrate 15 along a crystallographic direction of the substrate 15 that is parallel to the (001) crystallographic plane. As shown in the figures, the crystallographic direction is a <110> direction and may be either the [-110] or the [1-10], according to this embodiment. The crystallographic planes oriented parallel to the surface 20 of the substrate 15 are part of the {100} family of planes. The designation of the (001) planes in particular as parallel to the surface is arbitrary; the parallel planes could alternatively be designated as (100) or (010) due to their crystallographic equivalency with the (001) planes. In an embodiment in which the (100) planes are indicated as parallel to the surface, for example, the semiconductor substrate is a (100) substrate and the crystallographic directions parallel to the (100) plane are [01-1] and [0-11].

It is envisioned that, in other embodiments, crystallographic planes other than {100} planes (e.g., planes from the {110} or {111} family) may lie parallel to the surface of the substrate. For example, the substrate may be a (110) substrate. Similarly, the nanowires may be aligned in a crystallographic direction of the substrate that is other than a <110> direction, such as a <100> direction (e.g., [001]). In all embodiments, the crystallographic direction along which the nanowires are aligned is parallel with the crystallographic plane that lies parallel to the surface of the substrate.

The metal nanoparticle 25 in contact with the end of the planar semiconductor nanowire 10 may be a gold (Au) nanoparticle. The size of the nanoparticle 25 influences the diameter or other lateral dimension of the resulting planar semiconductor nanowire 10, and is thus selected accordingly. The term "other lateral dimension" is used as the nanowires are not necessarily cylindrical in shape. For example, planar semiconductor nanowires formed from smaller nanoparticles generally have a half-cylindrical shape on the substrate, whereas planar semiconductor nanowires grown from larger nanoparticles (e.g., greater than about 30 nm) may have a faceted shape, such as a trapezoidal transverse cross-section.

A nanoparticle having a diameter of about 100 nm or less may yield planar semiconductor nanowires of less than about 100 nm in lateral dimension. The nanoparticle diameter may be, for example, from about 1 nm to about 50 nm, or from about 5 nm to about 20 nm. For some applications, larger size nanowires may be desired, and thus larger nanoparticles may be employed for the growth process. For example, nanoparticles of about 100 nm to about 300 nm in diameter, or from about 150 nm to about 250 nm in diameter, may be suitable for electronic applications.

Figure 2A:
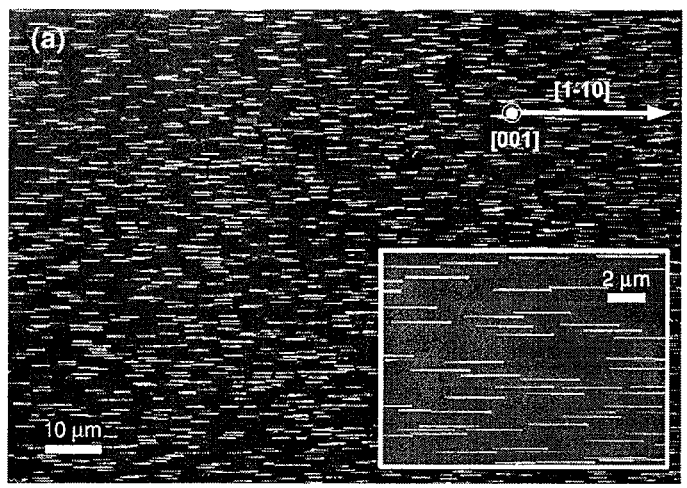
FIGS. 2A-2C are scanning electron microscope (SEM) images of <110> aligned GaAs planar nanowires on a GaAs (100) substrate, where the planar nanowires were grown at 460° C.
Figure 2B:
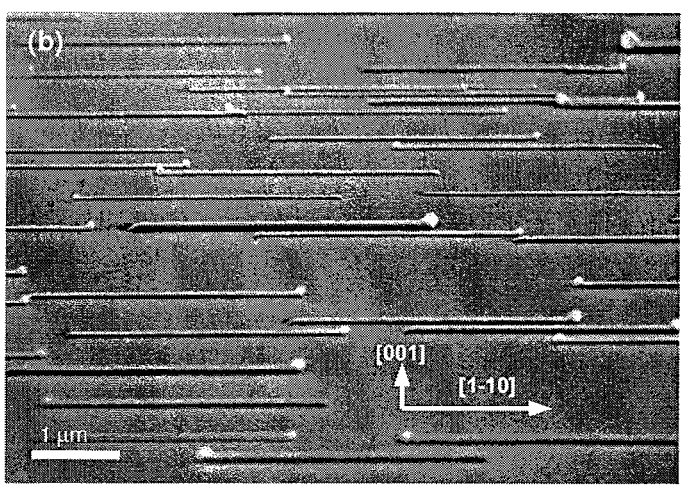
Figure 2C:
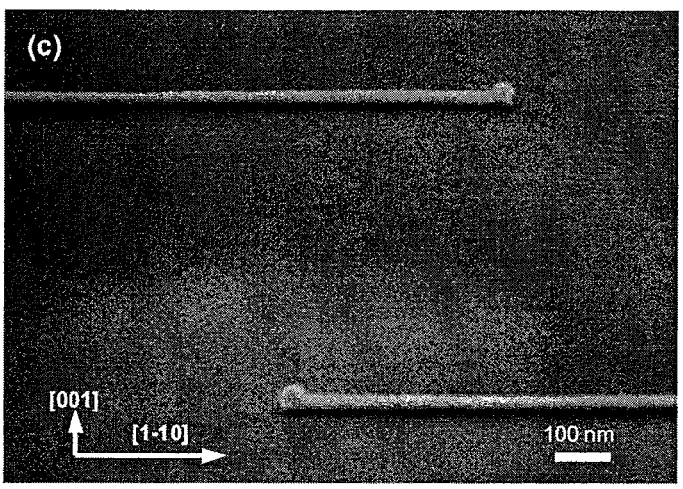

Referring to FIGS. 2A-2C, a plurality of planar semiconductor nanowires may be epitaxially disposed on the substrate and aligned in the same crystallographic direction, such as the [1-10] direction, thereby forming an array of planar nanowires. The positioning of each nanowire in the array is generally determined by the location of each metal nanoparticle used as a catalyst for the growth process. The spacing between adjacent planar nanowires may be as small as about 15 nm, thereby providing a higher density of nanowires in the array. Alternatively, the spacing may be much larger. The planar semiconductor nanowires may be grown to any desired length. Planar GaAs nanowires of up to tens of microns in length have been demonstrated.

The semiconductor substrate is selected to provide an epitaxial relationship with the planar semiconductor nanowire. Having a low lattice mismatch between the nanowire and the substrate is advantageous. The semiconductor substrate may include a group IV, III-V, or II-VI semiconductor such as Si, Ge, GaAs, InAs, or ZnSe.

The planar semiconductor nanowire is preferably composed of a III-V semiconductor such as GaAs, InAs, or InP. The nanowire may also be composed of a group IV semiconductor, such as silicon, or a II-VI semiconductor, such as ZnSe. It is also envisioned that functional heterostructures may be incorporated within the nanowire.

Figure 3:
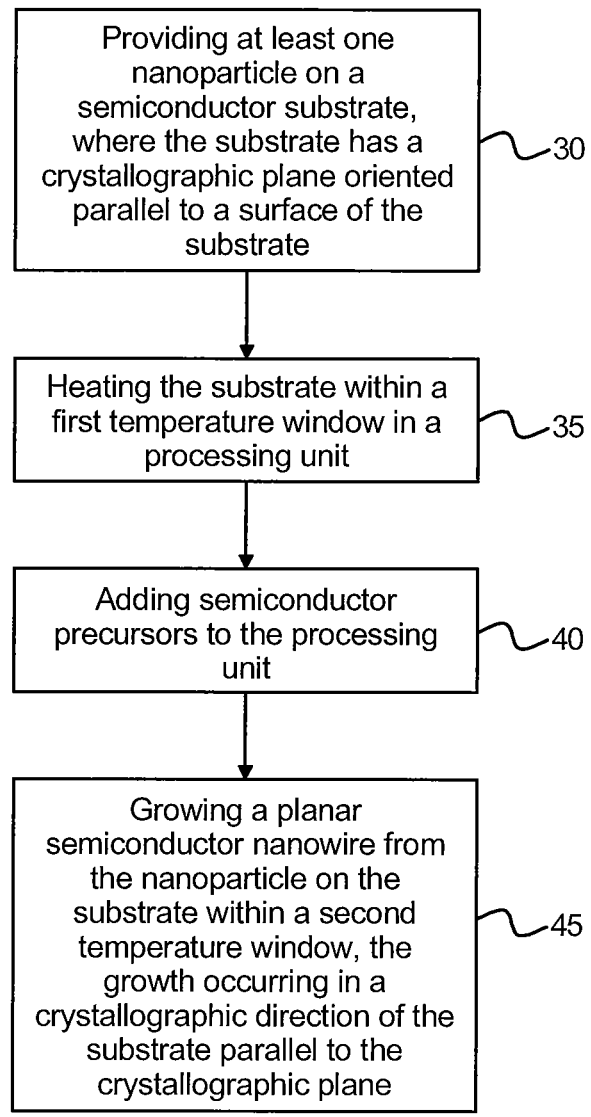
FIG. 3 is a flow chart of the growth method described herein according to one embodiment.

Referring to the flow chart of FIG. 3, a method for fabricating one or more self-aligned planar semiconductor nanowires includes providing 30 at least one nanoparticle on a semiconductor substrate, where the substrate has a crystallographic plane oriented parallel to a surface thereof, and heating 35 the substrate within a first temperature window in a processing unit. Semiconductor precursors are added 40 to the processing unit, and a planar semiconductor nanowire grows 45 from the nanoparticle on the substrate. The growth of the planar semiconductor nanowire occurs within a second temperature window and in a crystallographic direction of the substrate parallel to the crystallographic plane.

Advantageously, the planar semiconductor nanowire grows epitaxially on the substrate. The crystallographic direction of the substrate may be a <110> direction, and the crystallographic plane may be part of the {100} family of planes. For example, the semiconductor substrate may be a (100) substrate and the crystallographic direction may be the [01-1] or the [0-11], as described above. A plurality of planar semiconductor nanowires may be grown from a plurality of nanoparticles.

According to one embodiment, the first temperature window for heating the substrate is from about 600° C. to about 640° C., and the second temperature window is from about 420° C. to about 520° C. The processing unit may be a metalorganic chemical vapor deposition (MOCVD) reactor. The semiconductor precursors added to the processing unit may include trimethylgallium and arsine when GaAs nanowires are grown from gold nanoparticles. Typically, the semiconductor precursors are added at a V/III molar ratio in the range of from about 36 to about 90. Growth of the planar semiconductor nanowires may be carried out at atmospheric pressure.

The method may further entail, prior to heating the substrate in the second temperature window, depositing an epitaxial sacrificial layer on the substrate within a higher temperature window, such that the nanoparticle is elevated to a surface of the sacrificial layer and the sacrificial layer is situated between the nanoparticle and the substrate. According to this embodiment, the planar semiconductor nanowire grows epitaxially on the sacrificial layer when the substrate is within the second temperature window. The higher temperature window may be from about 600° C. to about 750° C., and the second temperature window may be from about 460° C. to about 480° C., according to this embodiment of the method.

The epitaxial sacrificial layer may then be removed to release the planar semiconductor nanowire from the substrate. A metal layer may be deposited onto the released semiconductor nanowire, and the metal layer and the semiconductor nanowire may be removed from the substrate (e.g., by peeling) and transferred to a second substrate. The second substrate may undergo a heat treatment, and the metal layer can be removed from the semiconductor nanowire, thereby providing a planar semiconductor nanowire on the second substrate.

According to another embodiment, the steps of depositing the sacrificial layer, adding the semiconductor precursors, and growing the planar semiconductor nanowire may be repeated at least one time to fabricate a vertical stack of planar semiconductor nanowires.

According to yet another embodiment, the planar semiconductor nanowire may be doped to be an n-type semiconductor. A source, drain, and gate may be fabricated in contact with the nanowire to form a metal-semiconductor field effect transistor (MESFET) comprising a planar nanowire channel.

Described in detail below are various embodiments of the method, including: 1) the vapor-liquid-solid (VLS) growth of planar nanowires self-aligned on a substrate, where the substrate used is (001), the nanowire orientation is <110>, and the nanowire diameter typically ranges from about 5 nm to about 75 nm, although other diameters are also possible; 2) the release of self-aligned nanowires from the substrate by growing and selectively removing a sacrificial layer below the nanowire layer; 3) the stacking of self-aligned nanowires in one growth direction vertically with barrier layers in between, by modulating the growth conditions to promote alternating growth of planar nanowires and vertical epitaxial overgrowth of barrier layers; and 4) the fabrication of electronic devices from the planar nanowires.

Advantages of embodiments of the present composition and method include 1) in situ planar geometry that can be readily integrated with existing microelectronics and photonics; 2) self-alignment to crystal orientation that is much more precise than ex-situ coarse alignment; 3) high aspect ratio (length/diameter) with uniform diameters as small as 5 nm without the well-known tapering effect of vertical nanowires; 4) lower twin defect density of the nanowires due to the nanowire orientation of compared to the conventional [111] orientation for III-V semiconductor nanowires; 5) a relatively large process window for growth temperature, growth rate and V/III ratio in a atmospheric pressure MOCVD reactor; 6) flexibility of having the nanowires epitaxially attached to the substrate in plane or tethered to the substrate simply by van der Waals force for transfer printing applications; 7) the capability of vertical stacking of nanowires; 8) the capability of self-aligned bridged nanowire structures; 9) the capability of forming smooth p-n junctions between the planar nanowire and the substrate or underlying layer that is oppositely doped; and 10) the capability of forming heterojunctions within the nanowire for the manufacture of functional planar nanowire devices.

Examples of the growth of self-aligned planar GaAs nanowires using atmospheric pressure MOCVD on a GaAs substrate are described in detail. The growth modes between planar and angled nanowires can be modulated by growth temperature. After preparation of the GaAs substrate, the substrate is transported to the MOCVD reactor and annealed at about 600° C. (1112° F.) to about 640° C. (1184° F.), and more preferably about 620° C. (1148° F.) under $AsH_3$ flow for about 10 minutes. The annealing step serves to alloy the Au with the GaAs substrate and desorb any residual native oxide. A gallium precursor, such as trimethylgallium (TMGa) is preferably subsequently introduced into the MOCVD reactor. The temperature window for the planar nanowire formation is about 460° C. (860° F.) to about 480° C. (896° F.) at the experimental condition specified. The planar nanowires are low in twin defect density, show high conductance and have a diameter that ranges from about 5 nm to about 75 nm. Methods of planar nanowire growth provide a new means for integrating nanowire based devices with existing planar semiconductor technology, and offer an opportunity for unique nanowire based electronic and optoelectronic devices. For example, planar nanowires are preferred for multi-gate transistors, addressable detector arrays and electrically pumped nanowire lasers.

Semiconductor nanowire growth is typically via the vapor-liquid-solid (VLS) mechanism, which is based on growth from liquid alloy droplets between a metal catalyst and a semiconductor interface. The driving force for crystallization is the supersaturation of source molecules in liquid metal droplets which is established by catalytic absorption of gas reactants. The vapor-solid-solid (VSS) mechanism has also been observed for the growth of III-V and silicon nanowires. The diameters of the nanowires are determined by the size of the seed particles, while the growth direction has largely been reported to depend on the surface free energy. For cubic lattices, the lowest free energy surface is [111]B and thus GaAs (111)B substrates are often selected to grow vertically aligned GaAs nanowires oriented perpendicular to the substrates. However, the <111> direction is susceptible to rotational twinning that degrades the electrical and optical properties of III-V semiconductor nanowires, and all other orientations have been found to have fewer defects than the <111> direction. Furthermore, the high aspect ratio of vertical nanowire geometry may be incompatible with existing planar processing technology for microelectronics. Ex-situ transfer and assembly techniques have to be used to transfer the vertical wires off the growth substrate and align them onto a functional device substrate.

When substrates of other orientations such as (100) are used in the prior art, most nanowires still grow in the <111> direction, which is 35.3° angled from the substrate. Other growth directions have been observed sporadically during nanowire growth, presumably due to modification of free energy by strain, surface tension etc. Persistent growth of InP nanowires in [001] direction on (001) InP substrates has been achieved by blocking the growth of all other growth modes. Recently, vertical standing Ge nanowires on GaAs (110) substrates have been grown with yield as high as 40%, and ZnSe <110> vertical nanowire growth using a small Au catalyst was also reported. The growth of lateral ZnO nanowires on an a-plane sapphire substrate was demonstrated using phase transport process through the control of catalyst size and spacing.

As indicated by transmission electron microscopy (TEM) results, the present planar nanowires are epitaxially attached to the substrate. For certain applications, it may be desirable to have the nanowires detached from the substrate. This can be achieved by growing an epitaxial sacrificial layer before the growth of the planar nanowires, which can be selectively removed to release the nanowires from the substrate. For GaAs materials, however, the most commonly used sacrificial layer $Al_xGa_{1-x}As$ (x>about 0.5) is oxidized in air and is preferably not used as the surface for Au catalyst deposition for subsequent epitaxial planar nanowire growth.

A method to grow the sacrificial layer in situ and continue to elevate the Au nanoparticle catalyst to the top of the surface is provided by modulating the growth condition to favor the noncatalyzed epitaxial overgrowth on the substrate or the Au catalyzed VLS growth mechanism. In addition, multi-stack planar GaAs nanowires separated by $Al_xGa_{1-x}As$ barrier layers can be fabricated and used as a potential quantum wire laser materials system.

In one example, nanowires were grown with a Thomas Swan atmospheric pressure MOCVD reactor. Trimethylgallium (TMGa) and arsine ($AsH_3$) were used as the gallium and arsenic precursors respectively. Typical $AsH_3$ flow was about 200-500 sccm and TMGa flow was at about 10 sccm.

GaAs (100) substrates were degreased and subsequently treated with diluted hydrochloric acid to remove the native oxide. Colloidal gold (Au) nanoparticles with about 5 nm to about 20 nm nominal diameters were then directly deposited on the substrate. After colloidal gold deposition, the samples were transported to the MOCVD reactor and annealed at about 620° C. (1148° F.) under $AsH_3$ flow for about 10 minutes. This step served to alloy the Au with the GaAs substrate and desorb any residual native oxide. The temperature was ramped down to the growth temperature (about 420° C. (788° F.) to about 520° C. (968° F.)) and TMGa was subsequently introduced into the reactor. After the growth, samples were cooled under $AsH_3$ flow. The substrates were not treated with an adhesion layer such as poly-L-lysine (PLL). PLL is often used to promote uniform deposition of colloidal gold but it has been shown that PLL can alter the orientation of nanowires by inhibiting bulk epitaxial growth.

Nanowire length and morphology were analyzed with a Hitachi 4800 scanning electron microscope (SEM) at about 15 kV. Transmission electron microscope (TEM) images were captured with a JEOL 2010Lab6 TEM. Elemental analysis was conducted with a JEOL 2010F with an attached Oxford EDS detector. TEM samples were prepared with standard mechanical polishing techniques.

FIGS. 2A-2C show an SEM images of GaAs nanowires grown using Au nanoparticles at 460° C. (860° F.) and 475° C. (887° F.). Under this growth condition, as many as 90% of the nanowires may be oriented in plane. Close examination shows that the alignment of the planar nanowires is near-perfect and growth initiates either towards either [1-10] or [-110] directions, as shown in the figures. The nanowires exhibit a smooth morphology with a cylindrical shape for diameters of about 30 nm or smaller. A few larger nanowires, with diameters ranging from about 40 nm to about 70 nm, start to exhibit crystal facets on the wire sidewalls, but the orientation is in plane.

Figure 4A:
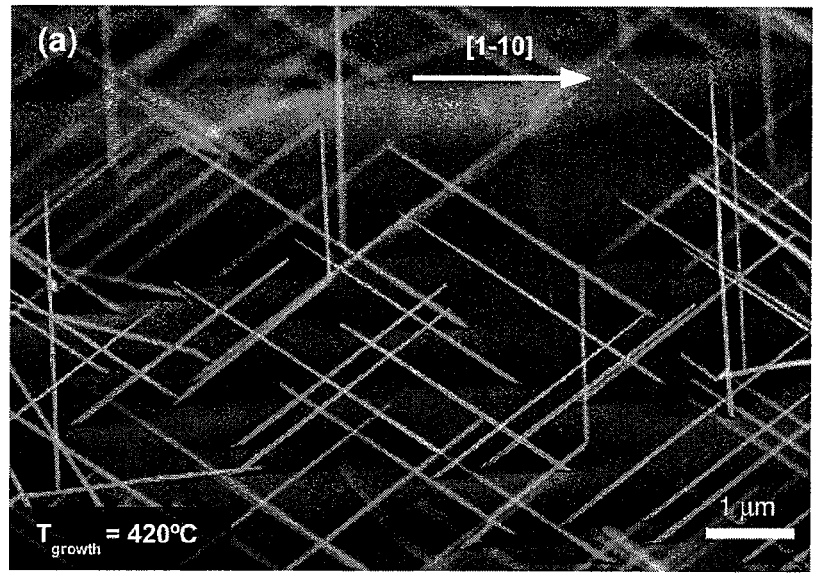
FIGS. 4A and 4B demonstrate the control over planar nanowire orientation and morphology provided by growth temperature in SEM images of samples tilted 75°, where
Figure 4B:
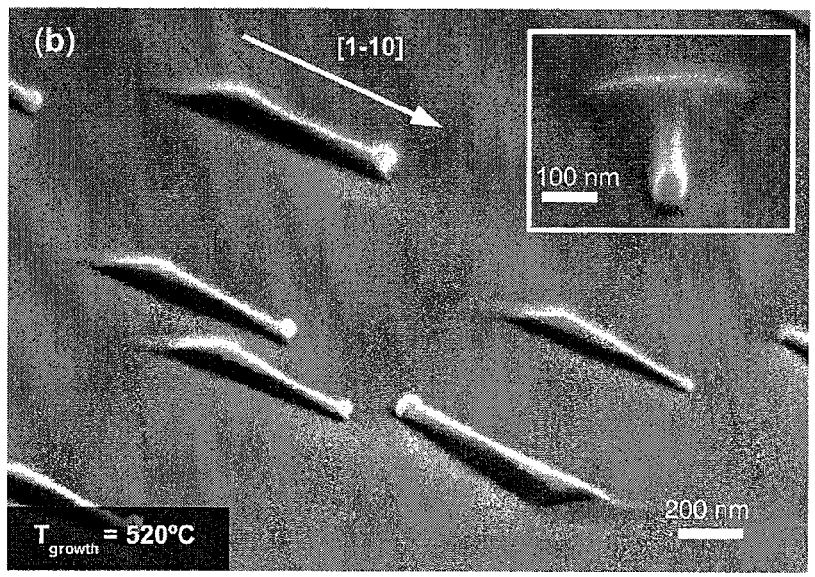

By changing the growth conditions, the yield of nanowires grown in the planar <110> versus angled <111> directions may be modulated. FIGS. 5A and 5B show SEM images of nanowires formed at 420° C. (788° F.) and 520° C. (968° F.), respectively. Planar <110> nanowires do not grow well at the lower temperature (as shown in FIG. 4A) and are replaced by mostly angled <111> nanowires. In contrast, at the higher growth temperature (as shown in FIG. 4B), well-aligned in-plane triangular shapes (appearing like a "school of tadpoles") are observed, with the apex of the triangle terminated with Au nanoparticles. The top surface of the planar triangular wire is (001), while the sidewall facets of the triangles appear to be (111). The lengths of these triangular planar wires are noticeably shorter than those cylindrical planar nanowires at 460° C. (860° F.). The shape of these triangular wires can be attributed in part to the simultaneous growth along the Au catalyzed nanowire growth direction <110>, and the temperature enhanced epitaxial growth on sidewalls of the nanowires. The sidewall growth suppresses in part the VLS lateral growth, leading to lower lateral growth rate. This is analogous to tapered vertical nanowire growth on (111)B substrates, where a wider base in contact with the substrate and narrower top are formed at elevated temperatures and over a longer growth time.

Figure 5:
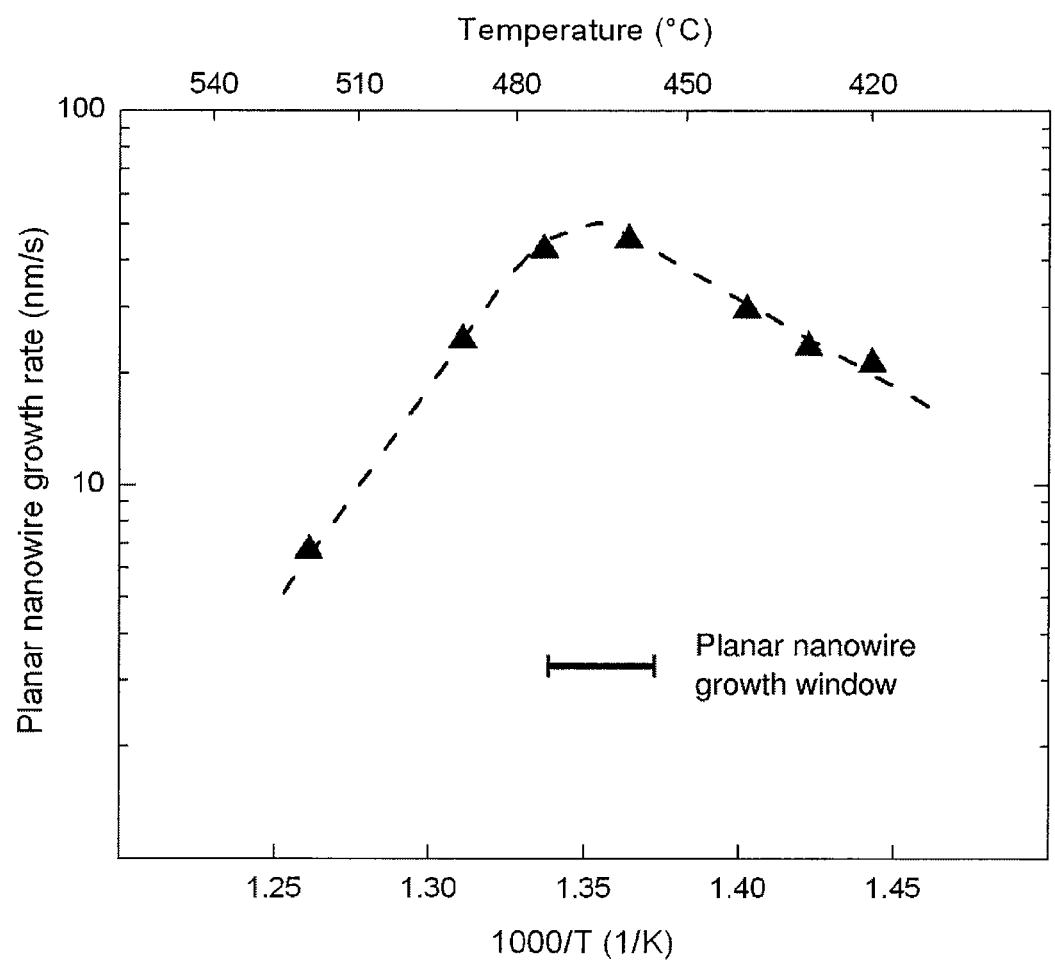
FIG. 5 shows an Arrhenius plot of planar nanowire growth rate.

Temperature, a well-controllable growth parameter, contributes to the nanowire growth orientation. A growth window of about 465±10° C., or about 470±10° C., has been identified as a preferred temperature for planar [1-10] or [-110] cylindrical nanowire growth in reactors for the present nanowires under the specified flow conditions. The optimum growth window for <110> planar nanowires with uniform diameters is in the region where the axial growth rate is the highest. As high as a 95% yield of planar <110> nanowires with a substantially uniform diameter may be achieved. Shown in FIG. 5 is an Arrhenius plot of the planar nanowire lateral growth rate as a function of growth temperature. The analysis is limited to regions of low nanowire density where there is little competition between nanowires for surface diffusing adatoms. The lateral growth rate increases with temperature initially then reaches a maximum before dropping at higher temperatures, with the yield of cylindrical <110> planar nanowires being highest in this region.

The Arrhenius plot of FIG. 5 for the present planar nanowire lateral growth rate resembles that for the MOCVD grown vertical GaAs <111> nanowires using the similar metalorganic precursors, not only qualitatively, but also in extracted activation energy. Moreover, the activation energy for VLS nanowire growth is approximately the same as that for bulk epitaxial growth on a (100) GaAs substrate with no catalyst and the onset of the plateau corresponds to the complete pyrolysis temperature of the metalorganic precursor TMGa. This indicates that VLS growth is hindered in part kinetically by the diffusion of Ga into Au nanoparticles, since the nanowire growth rate increases with temperature below $T_{peak}$. The growth rate plateau versus the temperature suggests that VLS induced GaAs reaction rate (no longer diffusion limited) does not change much with temperature. Above $T_{peak}$, nanowire lateral growth competes with bulk epitaxial and nanowire sidewall growth, resulting in a decreasing growth rate with increasing temperature.

Figure 6A:
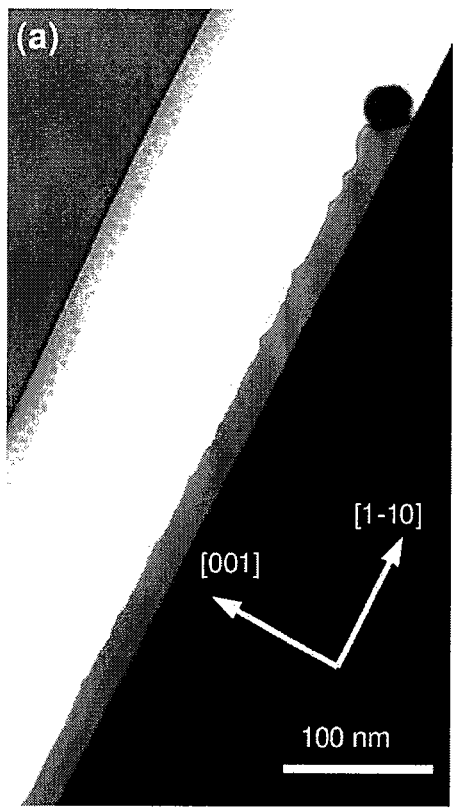
FIGS. 6A-6D show transmission electron microscope (TEM) images of planar GaAs nanowires that grow epitaxially on a surface and form two types of interfaces with the Au catalyst, where the insets show the largely defect-free zinc-blende lattice (scale bars are 2.5 nm)
Figure 6B:
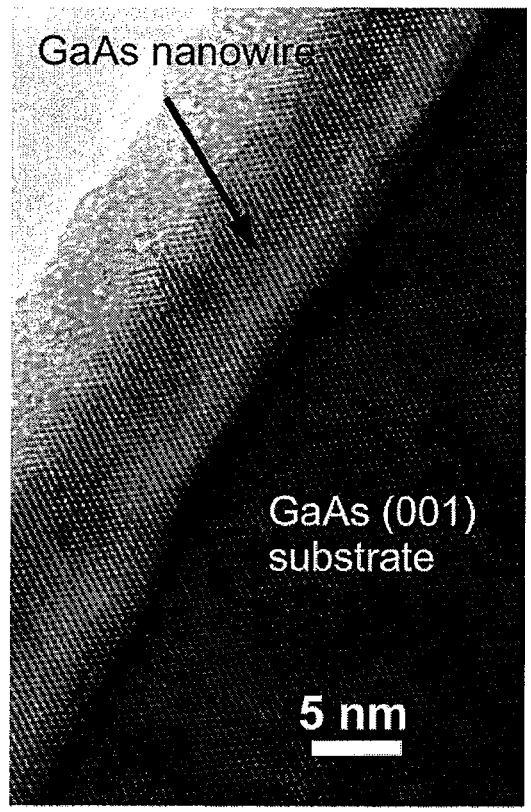
Figure 6C:
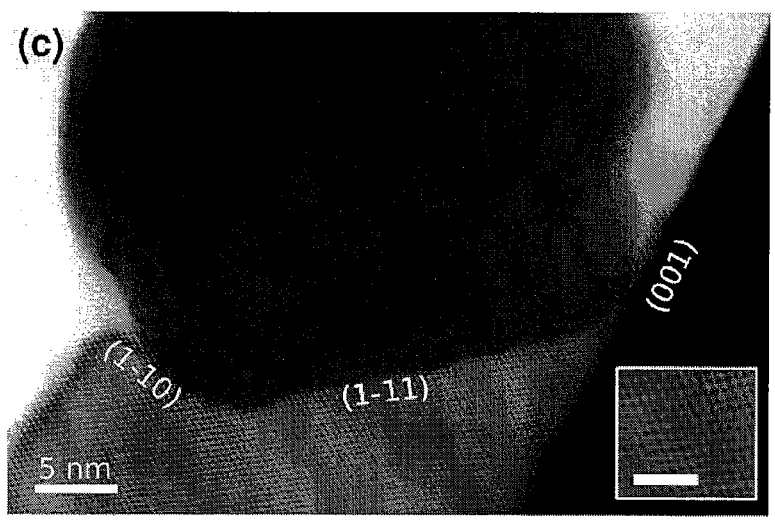
Figure 6D:
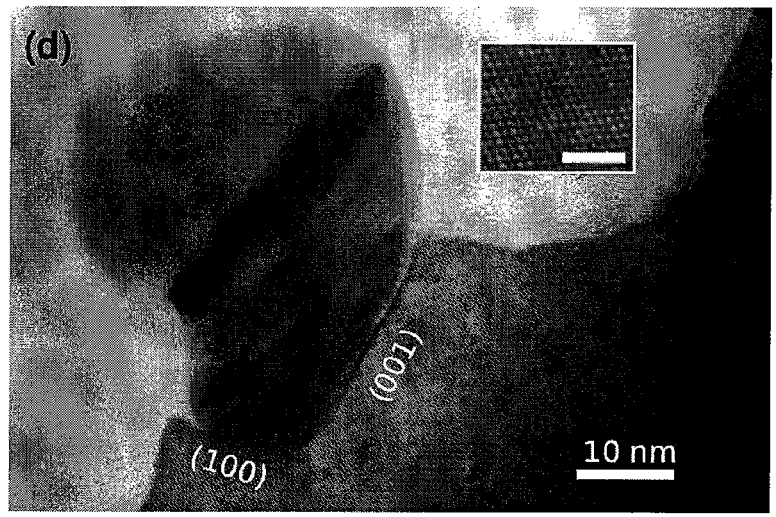

Shown in FIG. 6A is a TEM image of a planar GaAs nanowire terminated by a metal particle, post growth. FIG. 6B shows a high resolution TEM image obtained from the interface between the GaAs planar nanowire and the (100) GaAs substrate. The GaAs nanowire extends the substrate lattice epitaxially and its growth direction is along the <110> direction. Few misfit dislocations and stacking faults are observed, in contrast to the high density of twin defects reported in GaAs <111> nanowires. Unlike the <111> nanowires, the interface between Au and GaAs is not perpendicular to the nanowire growth direction. Shown in FIG. 6C and FIG. 6D are two types of Au—GaAs interfaces observed for the present planar nanowires, where the (1-11) interface appears along with (1-10) and (001) in FIG. 6C and (110) and (100) appear in FIG. 6D. The Au metal particle is preferably not homogeneous and distinct twins have been observed. A composition analysis by EDS of Au particles indicates a Ga composition of about 1-5%. The observation of different types of interfaces suggests that Au particles could be mobile during or after growth. During cool down under $AsH_3$ overpressure, the Ga supersaturated Au particle continues to form monolayers of GaAs and to solidify to interfaces that might be different from those during growth.

Along the length of the nanowire, near the Au catalyst, is a periodic deviation of the nanowire diameter of approximately +/−2.5 nm. The diameter fluctuation is limited to regions of less than about 0.5 urn from the Au—GaAs interface. Further away from the catalyst, the diameter instability disappears, based in part from epitaxial growth that occurs on the nanowire sidewall, which tends to smooth out the diameter variation. Periodic instability of nanowire diameter has been observed for non-planar nanowires and is attributed to a feedback mechanism in the supersaturation of the catalyst. Preferably, the growth direction of a nanowire is determined by surface free energy. The surface free energy could be modified depending on nanowire density and size (thus edge tension), as well as substrate type and Au/Ga eutectic composition Ga/Au composition. Planar wires as large as about 60 nm in diameter are observed. Larger wires show clear sidewall facets instead of the smooth cylindrical morphology for smaller ones. Close examination of planar nanowire geometry shows an angled sidewall at the onset of nanowire formation, which is in the opposite direction to nanowire facet at the growth front.

There are three competing growth channels in a MOCVD growth environment: VLS growth from the Au catalyst (axial growth); uncatalyzed growth from the sidewall (radial growth) and uncatalyzed overgrowth on the substrate. The growth rate of sidewall radial growth increases while the VLS axial growth rate decreases as temperature increases. When the temperature is high enough (the onset of the plateau in FIG. 5), planar nanowire VLS growth initiates in the angled <111> direction via VLS mechanism and is pinned to the (100) substrate due in part to growth from the lower angle inner sidewall within a few monolayers. Planar growth then proceeds by the Au catalyzed VLS mechanism indefinitely. This is similar to the observation of vertical <110> Ge nanowire growth mechanism proposed, where the nanowire initially grows along the direction close to <111> and switches to a <110> direction. The energetics of the initial nucleus plays a critical role in determining the nanowire growth direction. As expected, in a two step temperature growth experiment where initial growth is carried out at 460° C. (860° F.), the temperature is ramped down to 420° C. (788° F.) for continued growth.

As indicated by the TEM results, the planar nanowires are epitaxially attached to the substrate. For certain applications, it is desirable to have the nanowires detached from the growth substrate and transferred to a foreign substrate such as silicon or flexible polymer. For out-of-plane nanowires, this is typically done by sonicating the nanowires from the growth substrate into a solution followed by dispersion onto a foreign substrate. However, achieving both the controlled positioning and alignment of transferred nanowires on a wafer-scale has not been previously demonstrated. In the present case, the transfer of planar nanowires can be achieved by growing the nanowires on a sacrificial layer epitaxially deposited on the substrate, and then the nanowires can be released from the substrate (while maintaining their position and alignment) by selectively removing the sacrificial layer. The planar semiconductor nanowires are epitaxially disposed on a sacrificial layer between the substrate and the nanowire, and the sacrificial layer is epitaxially disposed on the substrate. Thus, it is possible to exploit the as-grown alignment along the <110> direction and to control the position of nanowires through patterned catalyst. The released nanowires can then be transferred to a foreign substrate.

Figure 7A:
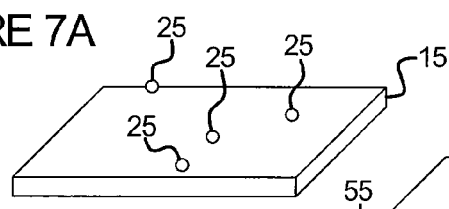
FIGS. 7A-7D show a perspective view of a process, according to one embodiment, to release planar nanowires from a substrate while maintaining the original alignment of the nanowires.
Figure 7B:
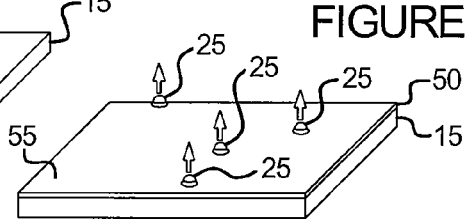
Figure 7C:
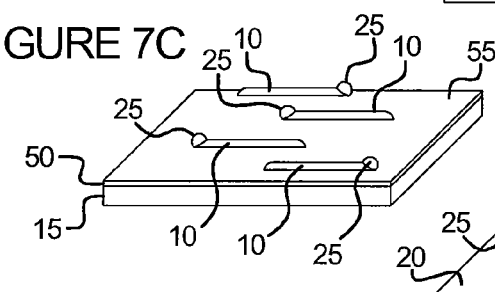

For GaAs materials, the most commonly used sacrificial layer, $Al_xGa_{1-x}As$ (x>=0.5), is easily oxidized in air and cannot be used as the surface for Au catalyst deposition for subsequent planar nanowire growth. Instead, a method to grow the sacrificial layer after the Au nanoparticles are deposited is described here and schematically illustrated in FIGS. 7A-7D. Au nanoparticles 25 are first deposited on the GaAs substrate 15 (FIG. 7A) which is then annealed as described above. A thin (25-50 nm) sacrificial $Al_{0.50}Ga_{0.50}As$ epilayer 50 is grown at 620° C. to favor noncatalyzed overgrowth on the substrate. The Au nanoparticles 25 are elevated under such growth conditions above the sacrificial layer 50 and onto the surface 55 thereof (FIG. 7B). The temperature is then ramped down to 460° C. to favor Au-catalyzed growth, and the planar GaAs nanowires 10 are grown on the $Al_{0.50}Ga_{0.50}As$ epilayer 50 (FIG. 7C). The samples are cooled under $AsH_3$ flow and removed from the MOCVD reactor.

Figure 7D:
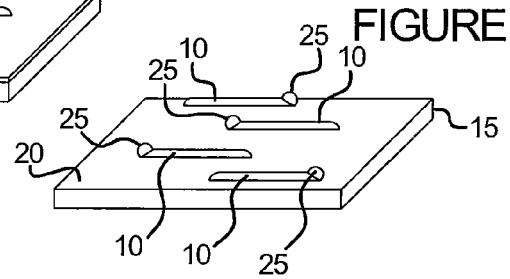
Figure 7E:
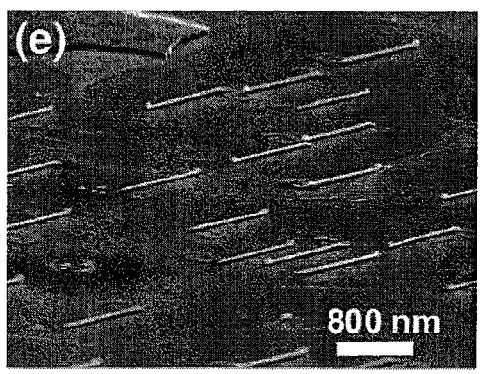
FIGS. 7E-7F are SEM images of fully released (FIG. 7E) and partially released (FIG. 7F) planar semiconductor nanowires.
Figure 7F:
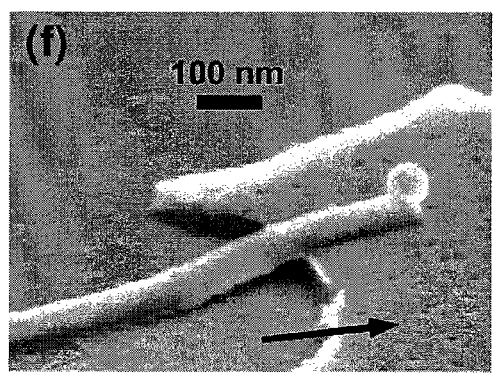

To release the GaAs nanowires 10 from the substrate, the $Al_{0.50}Ga_{0.50}As$ epilayer 50 may be wet etched and removed with aqueous HF (49% HF) (FIG. 7D). FIGS. 7E and 7F show the result of such a process after the sacrificial layer ($Al_{0.50}Ga_{0.50}As$) is etched with HF to release the GaAs nanowires. The alignment of the nanowires is substantially unchanged when they are released from the substrate.

The morphology and structural properties of GaAs nanowires grown on $Al_{0.50}Ga_{0.50}As$ are substantially identical to those of GaAs nanowires directly grown on a GaAs substrate. Using TEM it can be observed that GaAs nanowires grown on an $Al_{0.50}Ga_{0.50}As$ sacrificial layer also have an extremely low level of twin defects. Considering the epitaxial relationship between the planar GaAs nanowire and growth substrate (see FIG. 6B), this observation is consistent with the negligible lattice constant mismatch (0.07%) between GaAs and $Al_{0.50}Ga_{0.50}As$. In addition, the growth rates of GaAs nanowires grown on the sacrificial layer ($Al_{0.50}Ga_{0.50}As$) and directly on GaAs substrate are nearly equivalent. However, for a higher aluminum composition $Al_xGa_{1-x}As$ layer, reduced nanowire growth rate (Au-catalyzed) is observed due to the competing overgrowth on highly-reactive $Al_xGa_{1-x}As$ (x>~0.55). The overgrowth also prevents clean release of the nanowires in subsequent steps, making $Al_xGa_{1-x}As$ (x>0.5) not as suitable for a sacrificial layer.

Figure 8A:
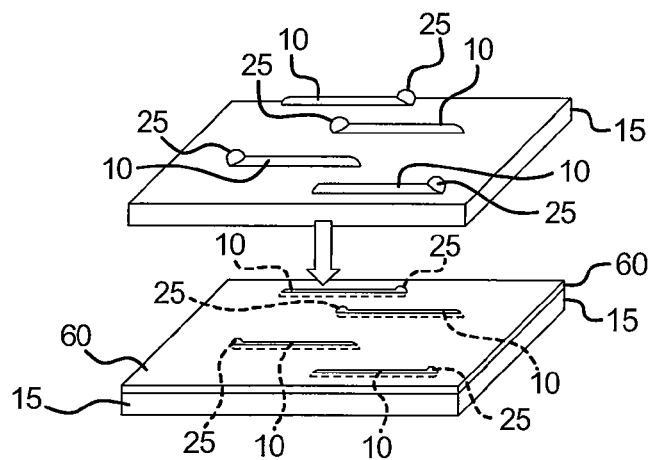
FIGS. 8A-8D show a perspective view of a process, according to one embodiment, to transfer highly-aligned nanowires to a different substrate.
Figure 8B:
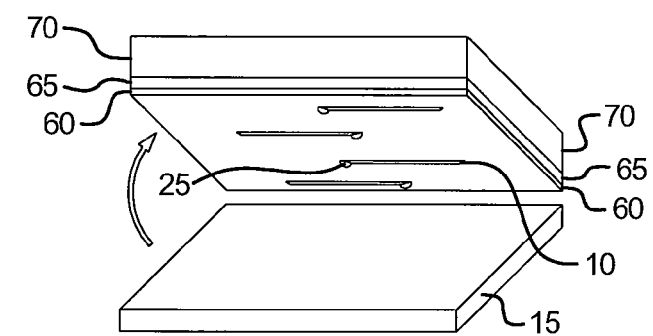
Figure 8C:
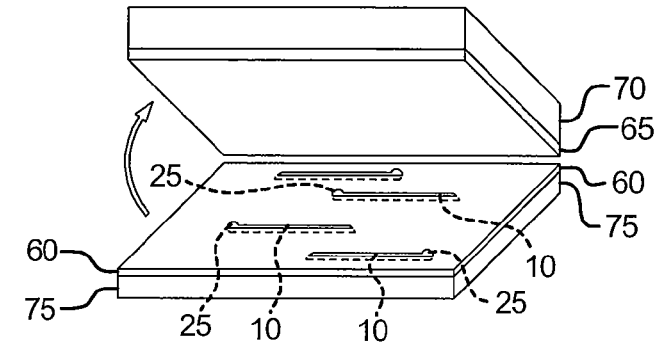
Figure 8D:
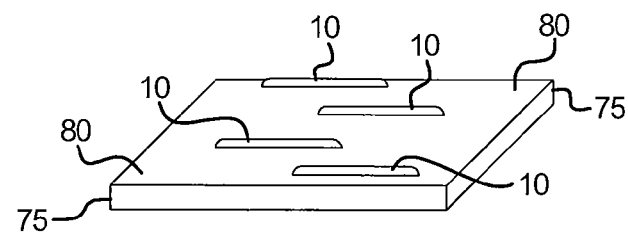

After the nanowires are released, they can readily be lifted-off and transfer-printed to desired substrates. GaAs nanowires have been successfully transferred from their native growth substrate to a silicon (100) substrate with the process illustrated in FIGS. 8A-8D. The GaAs nanowires 10 are first released from the growth substrate 15 using the procedure described previously, and then a 100 nm layer 60 of Au is evaporated onto the released nanowires 10 (FIG. 8A). Using thermal release tape 65 (REVALPHA, Nitto Denko) that is mounted on a poly(dimethylsiloxane) (PDMS) stamp 70, the Au layer 60, together with the nanowires 10, are then peeled off the growth substrate 15 (FIG. 8B). Evaporated Au 60 adheres poorly to the GaAs substrate 15 surface; however, the bond between the Au layer 60 and released nanowires 10 is strong enough such that the nanowires 10 remain attached to the Au layer 60 during this step. The Au layer 60 with nanowires 10 is then transferred to a bare silicon substrate 75 and the entire assembly is heated to 120° C. (FIG. 8C). This heating will cause the thermal tape 65 to lose its adhesion to the Au layer 60. The Au 60 with nanowires 10 will then remain on the silicon surface 80 after the PDMS stamp 70 and thermal tape 65 are removed from the silicon 75 (FIG. 8D). Finally, the Au 60 is removed with a 20 second KI/I2 (Transene) wet etch, thus revealing the aligned nanowires 10 on the silicon surface 80.

Figure 9A:
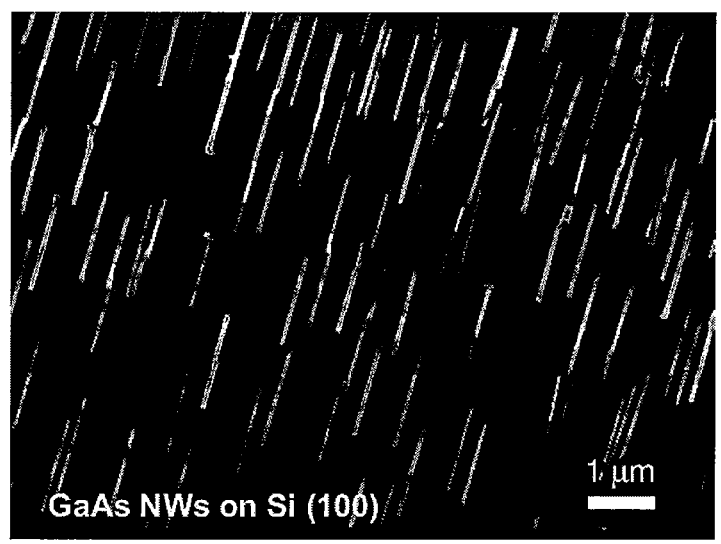
FIGS. 9A and 9B are lower and higher magnification images, respectively, of GaAs planar semiconductor nanowires that have been transferred to a silicon surface.
Figure 9B:
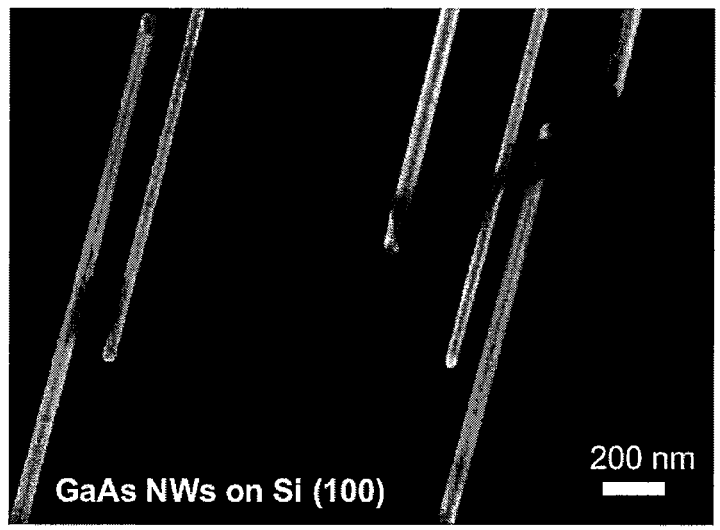

FIGS. 9A and 9B show SEM images of planar GaAs nanowires that have been transferred to a silicon substrate. Most of the nanowires have clearly maintained their alignment throughout the entire transfer process. The discoloration of the silicon surface and nanowires evident in FIGS. 9A and 9B is from the Au etchant, which tends to leave behind a scum that is difficult to rinse away. The transfer of planar nanowires to silicon has been demonstrated, and the same process can be used to transfer the nanowires to any substrate that can withstand a 120° C. bake and Au wet etch. The inventors believe this is the first demonstration of a large area direct transfer process for nanowires formed by a bottom-up approach that can control both the position and alignment of the nanowires. Also envisioned is patterning the catalyst and controlling the growth direction (e.g., [-110] or [1-10]) such that highly-aligned arrays of position-controlled nanowires can be transferred.

Figure 11A:
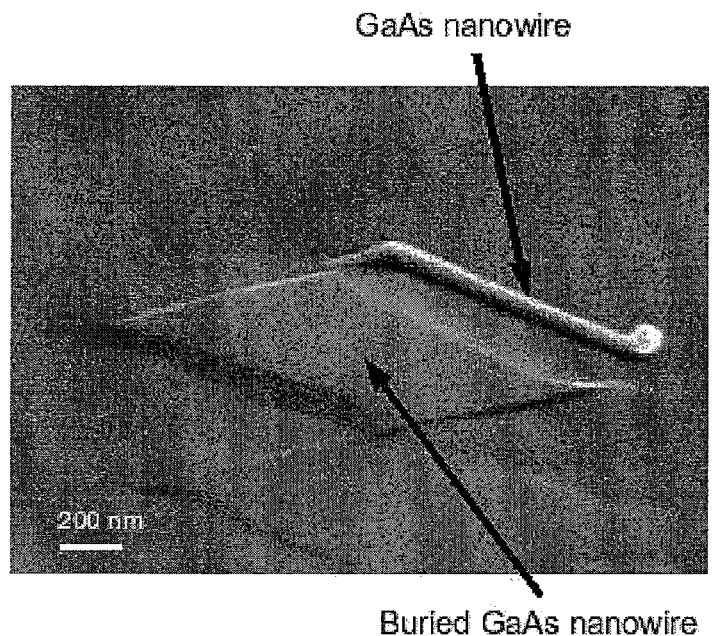
FIG. 11A is an SEM image of stacked GaAs nanowires that are self-aligned with each other and the substrate.
Figure 11B:
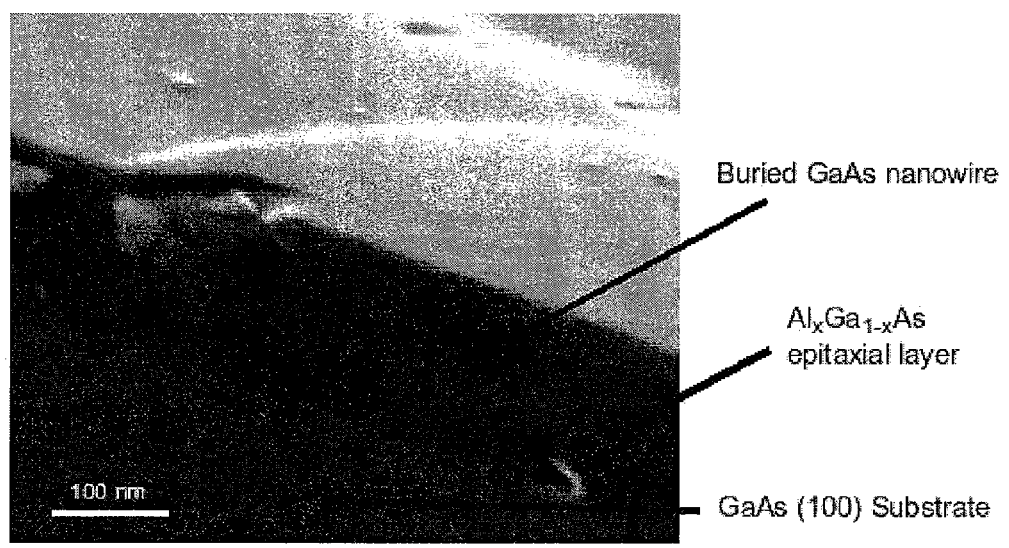
FIG. 11B shows an SEM image of a cleaved edge of a GaAs (100) substrate with GaAs nanowires grown between two $Al_xGa_{1-x}As$ epitaxial layers.

Alternatively, instead of releasing the planar semiconductor nanowires and transferring them to another substrate, a vertical stack of nanowires may be grown. Referring to FIGS. 10A and 10B, nanoparticles 25 may be deposited on the substrate 15 and an epitaxial layer 50 of $Al_xGa_{1-x}As$ (or another suitable material) may be grown, as described above. The nanoparticles 25 rise to the exposed surface 55 during growth of the epitaxial layer 50. The planar semiconductor nanowires 10 are then grown from the exposed nanoparticles 25, as shown schematically in FIG. 10C. Another epitaxial layer 50' of $Al_xGa_{1-x}As$ or another suitable material is grown, as shown in FIG. 10D, burying the nanowires 10 but once again leaving the nanoparticles 25 exposed on the surface 55'. Growth of the planar semiconductor nanowires 10 from the nanoparticles 25 can then be repeated, as shown in FIG. 10E, to fabricate a vertical stack 85 of planar semiconductor nanowires 10. The growth of the epitaxial layer 50 and the planar semiconductor nanowires 10 may be carried out any number of additional times to increase the height of the stack 85. FIG. 11A is an SEM image of stacked GaAs nanowires (one exposed, one buried) that are self-aligned with each other. FIG. 11B is an SEM image of a cleaved edge of a GaAs (100) substrate showing a GaAs nanowire grown between two $Al_xGa_{1-x}As$ epitaxial layers.

Also described herein is the fabrication of a metal-semiconductor field effect transistor (MESFET) from a planar semiconductor nanowire grown on a semiconductor substrate. Conventional semiconductor processing may be employed to form source, drain, and gate contact regions on the planar nanowire. The resulting self-assembled nanowire channel may have a trapezoidal cross-section advantageous for forming a tri-gate structure. Larger diameter nanowires have a tendency to form nanowires with a faceted surface structure, while smaller diameter nanowires generally grow with a half-cylindrical shape. The nanowire MESFET may be fabricated with sufficiently high material quality (low defectivity) to exhibit bulk-like electron mobility. For example, a long-channel MESFET may be fabricated from an intentionally doped n-type planar GaAs nanowire channel grown on a semi-insulating (SI) GaAs (100) substrate (or, equivalently, a SI GaAs (001) substrate). The fabrication and characterization of such a device is described below.

Planar GaAs nanowires can be grown using a gold (Au) catalyst in an atmospheric pressure Thomas Swan MOCVD reactor. Colloidal Au nanoparticles with 250 nm nominal diameter are dispersed onto a SI GaAs (100) substrate. The substrate is then loaded into the MOCVD reactor and GaAs planar nanowires are grown at 460° C. Trimethylgallium (TMGa) and arsine ($AsH_3$) are used as Ga and As precursors, respectively. The nanowires are intentionally doped n-type with silicon using a disilane ($Si_2H_6$) precursor. More details of the planar nanowire growth process are provided above.

Figure 12A:
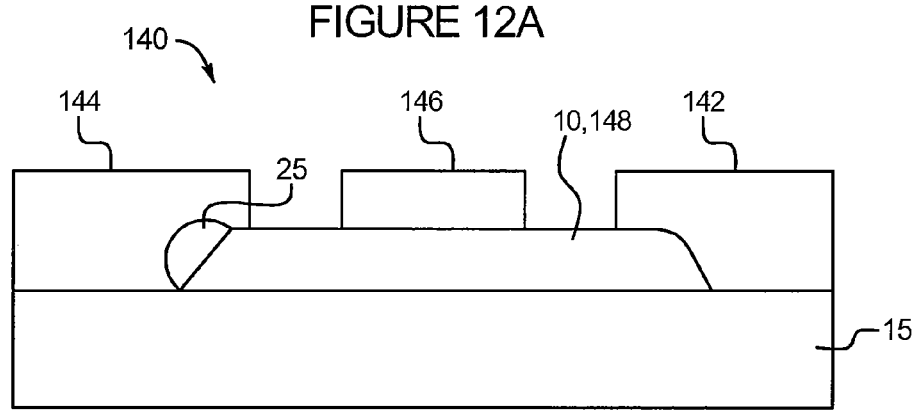
FIG. 12A is a schematic of a device cross-section along a longitudinal direction.
Figure 12B:
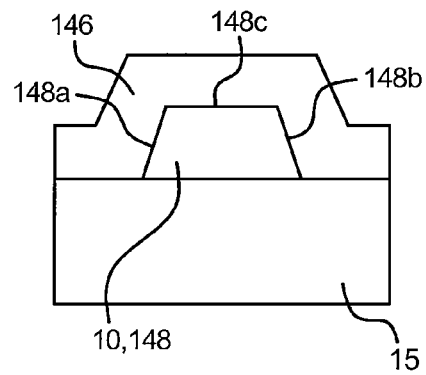
FIG. 12B is a schematic of a device cross-section along a transverse direction.
Figure 12C:
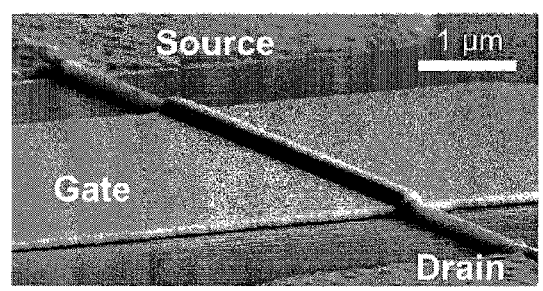
FIG. 12C is an SEM image of a planar semiconductor nanowire metal-semiconductor field effect transistor (MESFET)

Shown in FIGS. 12A-12C are illustrations and an SEM image of a fully processed nanowire-MESFET 140. Conventional UV-lithography is used to pattern the drain/source 142, 144 and gate 146 contact regions for subsequent e-beam metal evaporation and liftoff. Ohmic drain/source contacts 142, 144 are formed using Ge/Au/Ni/Au with annealing, while the Schottky gate contact 146 is formed using Ti/Au metals without anneal.

The cross section of the planar nanowire channel 148 is trapezoidal with well-defined {111} sidewall facets 148a, 148b (angled 54.7° from the substrate surface) and a {100} top facet 148c (FIG. 12B). The gate 146 then naturally forms a tri-gate structure with geometry and dimensions that are controlled during the nanowire 10 growth. For ease of fabrication, the contacts and probe pads are deposited directly on the SI substrate without isolation. The device geometry of this example has a gate length of 4.1 μm and a drain-to-source spacing of 7.8 μm. The dimensions of the base and top facet of the trapezoidal cross-section are 282 nm and 96 nm, respectively, and the height of the trapezoidal cross-section is 131 nm, with little variation along the entire length of the nanowire.

Figure 13A:
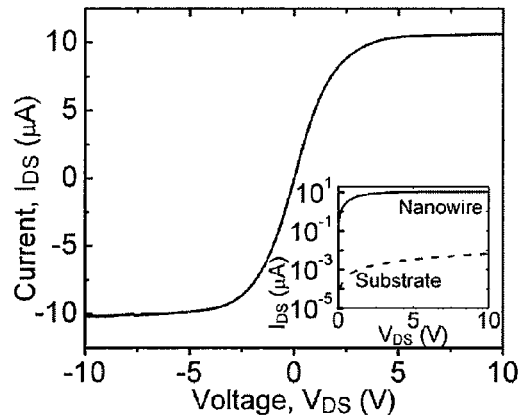
FIG. 13A is a two-terminal current-voltage (I-V) curve between the drain and source of the device of FIG. 12A prior to gate deposition.
Figure 13B:
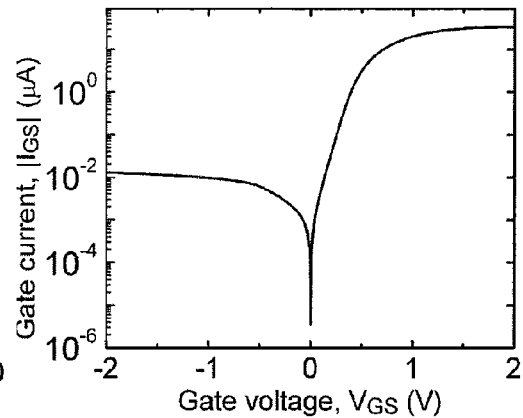
FIG. 13B is the gate I-V characteristic.

Shown in FIG. 13A is the two-terminal current-voltage (I-V) curve between the drain and source for the planar nanowire MESFET before gate deposition. The I-V curve is linear for $|V_{DS}|$ less than about 2 V indicating good ohmic contacts to the nanowire. However, for $|V_{DS}|>2$ V, the current is clearly saturated which is likely a result from electron velocity saturation in the nanowire channel. The saturation region, impacted by the scattering properties of the nanowire material, is typically associated more than any other region in the output characteristics with the intrinsic properties of the nanowire. The onset of current saturation in the nanowire occurs at an electric field of about 3 kV/cm which corresponds closely to the electric field required for velocity saturation in bulk GaAs, implying bulk-like nanowire quality. The leakage current (see dashed line of FIG. 13A inset) through the semi-insulating substrate (p>1×10$^7$ Ohm·cm) is found to be negligible compared to the nanowire current (roughly 3 orders of magnitude smaller). Shown in FIG. 13B is the two-terminal I-V characteristic of the Schottky gate contact with both the source and the drain grounded. Schottky diode behavior is clearly exhibited.

Figure 14A:
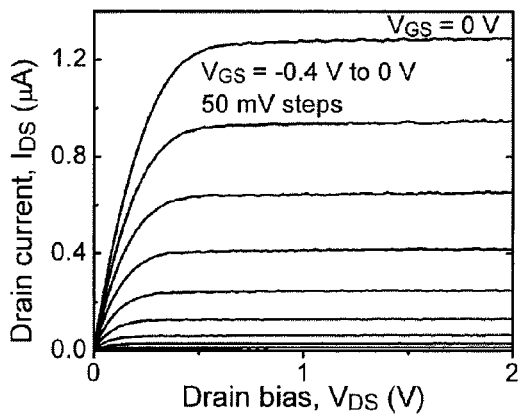
FIG. 14A shows planar nanowire MESFET output characteristics.
Figure 14B:
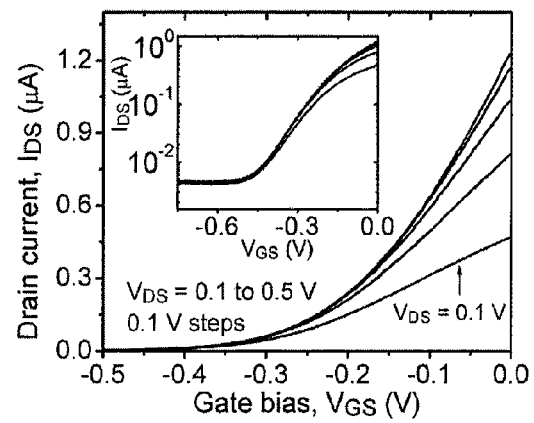
FIG. 14B shows planar nanowire MESFET transfer characteristics.

The nanowire-MESFET output characteristics are shown in FIG. 14A where drain current ($I_{DS}$) versus drain voltage ($V_{DS}$) measurements at several different gate voltages ($V_{GS}$). The device exhibits depletion-mode long channel characteristics with a well-defined transition from linear to pinchoff region followed by nearly constant $I_{DS}$ with increasing $V_{DS}$. The transfer characteristic ($I_{DS}$-$V_{GS}$) of the device is shown in FIG. 14B for several $V_{DS}$ values. The threshold voltage ($V_T$) is determined to be −282 mV at the drain bias $V_{DS}$=100 mV. The $I_{ON}/I_{OFF}$ ratio of the device is about 240 (FIG. 14B inset), and the sub-threshold swing (S) is approximately 150 mV/decade. A maximum gm of 23 mS/mm is obtained for $V_{DS}$=0.5 V.

The nanowire doping concentration ($N_d$) is determined by finding the value of $N_d$ that allows for complete channel pinchoff at the threshold bias conditions. This requires the solution of Poisson's equation for the transverse cross-section of the nanowire (e.g., the cross-section in FIG. 12B). Considering only ionized donor and electron concentrations, Poisson's equation can be written as $$-\nabla^2 \Phi = \frac{q}{\varepsilon_s}(N_d - n) = \frac{qN_d}{\varepsilon_s}(1 - e^{q\Phi/k_BT}) \qquad (1)$$

where $\varepsilon_s$ is the dielectric permittivity of GaAs ($\approx 13.1\varepsilon_0$), and Maxwell-Boltzmann statistics are assumed. Quantum mechanical effects can be safely neglected because of the relatively large size of the nanowire.

The trapezoidal cross section of the planar nanowire-MESFET does not allow for a simple analytical solution to eq. (1). Instead, the finite element method may be applied for a numerical solution. To determine $N_d$, the threshold bias conditions and built-in voltage are used to define the boundary conditions at the side and top facets of the nanowire. As an approximation, the SI substrate is treated as an ideal insulator and a vanishing electric field normal to the interface was assumed. Using this approach, the doping concentration is determined to be $N_d$=2.3·10$^{17}$ cm$^{-3}$.

Figure 15A:
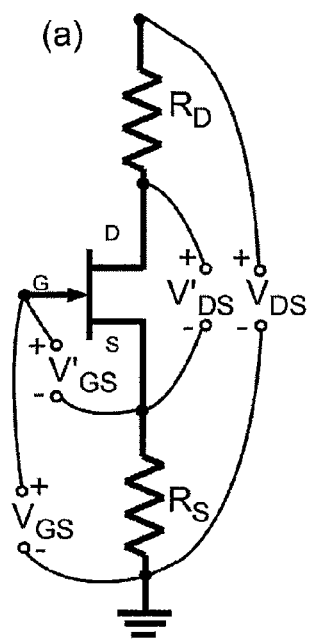
FIG. 15A shows an equivalent circuit for a planar nanowire MESFET used to model the device I-V characteristics in the linear regime.

To determine the low-field electron mobility ($\mu_n$), the nanowire-MESFET is modeled with a standard long-channel MESFET analysis generalized for an arbitrary nanowire cross-section geometry. The active, gated portion of the nanowire-MESFET can be modeled using the gradual channel approximation which is valid for a long-channel device. The ungated nanowire portion existing between the source/drain and gate contacts is included in the model as series resistance to accurately extract $\mu_n$. The equivalent circuit for the nanowire-MESFET is shown in FIG. 15A, where V'$_{GS}$ and V'$_{DS}$ represent the reduced potentials in the gated portion $$V'_{GS}=V_{GS}-R_S I_{DS} \qquad (2)$$

$$V'_{DS}=V_{DS}-I_{DS}(R_D+R_S) \qquad (3)$$

and $R_S$ and $R_D$ are the source and drain series resistances. $R_S$ and $R_D$ determined from the resistance per unit length ($R_l$=23.5 kΩ/μm) of the ungated nanowire portion that can be extracted from the two-terminal I-V data in FIG. 13A (the effect of drain/source contact resistance is also indirectly included in $R_l$). In the linear regime of operation, the current ($I_{CH}$) at any point (x) in the gated portion of the nanowire-MESFET channel is $$|I_{CH}(x)| = qN_d\mu_n A(V'_{GS}, V_x)\frac{dV_x(x)}{dx} \qquad (4)$$

where $V_x(x)$ is the channel potential, $A(V'_{GS},V_x)$ is the generalized cross-section area of the undepleted conducting region of the channel and is a function of both V'$_{GS}$ and $V_x$, and L is the gated channel length. Assuming current is constant along the channel, the drain current ($I_{DS}$) of the device can be determined by integration:

$$I_{DS} = (qN_d\mu_n/L)\int_{V_x(0)=0}^{V_x(L)=V'_{DS}} A(V'_{GS}, V_x)dV_x \qquad (5)$$

The integral in eq. (5) can be numerically evaluated for a particular value of V'$_{GS}$ by solving eq. (1) to calculate and sum the values of A(V'$_{GS}$,V$_x$) for incremental values of V$_x$ between V$_x$=0 and V$_x$=V'$_{DS}$. Equation (5) can then be solved in a self-consistent manner with eq. (2) and eq. (3) such that the current is equivalent through both the gated and ungated device regions.

Figure 15B:
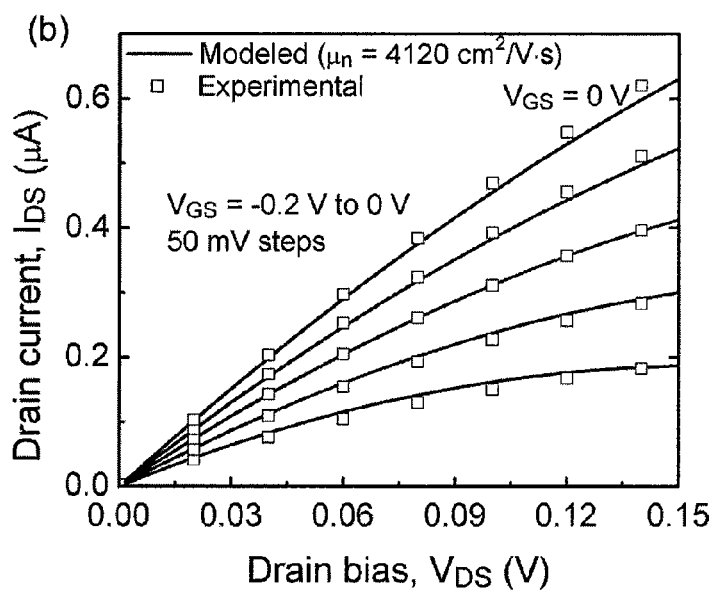
FIG. 15B shows modeled and experimental $I_{DS}$-$V_{GS}$ curves.

Using this approach, a low field electron mobility of $\mu_n$=4120 cm$^2$/V·s is extracted. This value corresponds closely with reported values of electron mobility in bulk GaAs with a doping density of $N_d$≈2·10$^{17}$ cm$^{-3}$. This is indicative of the excellent material quality of planar GaAs nanowires. Shown in FIG. 15B are calculated IDS-VGS curves solved from (5)

with $\mu_n$=4120 cm$^2$/V·s in the linear regime of device operation, which shows excellent agreement with the experimental data.

In summary, self-aligned planar <110> GaAs nanowires grown by atmospheric pressure MOCVD on GaAs (100) substrates have been described. The growth method is contemplated to be applicable to other semiconductor materials grown by MOCVD as well. The growth modes between planar and angled nanowires can be modulated by growth temperature. The temperature window for the planar nanowire formation is ~20° C. at the experimental condition specified. The present research could potentially lead to large scale integration with existing microelectronics due to the planar geometry and also rejuvenate nanowire related optoelectronic research due to the extremely low level of crystal imperfection. The possibility of producing vertical stacks of self-aligned planar nanowires and of transferring the self-aligned planar nanowires to other substrates while maintaining both their position and alignment has been demonstrated, which could enable flexible electronics and photonics at a true nanometer scale.

Furthermore, the first GaAs MESFET fabricated with a self-assembled planar nanowire channel has been described. The material quality of such a nanowire channel is manifested in its bulk-like electron mobility. The inventors expect that, with smaller diameter nanowires, a short-channel self-aligned process, higher-mobility lower-bandgap III-V nanowires (such as InAs), and a suitable gate oxide, nanowire-FETs having planar <110> nanowires as channels can achieve significantly enhanced transfer characteristics. Considering their planar, self-aligned, and transferable nature, nanowire-FETs hold promise as a bottom-up approach for high performance III-V FETs for next generation analog and digital integrated circuit applications.

Although the present invention has been described in considerable detail with reference to certain embodiments thereof, other embodiments are possible without departing from the present invention. The spirit and scope of the appended claims should not be limited, therefore, to the description of the preferred embodiments contained herein. All embodiments that come within the meaning of the claims, either literally or by equivalence, are intended to be embraced therein. Furthermore, the advantages described above are not necessarily the only advantages of the invention, and it is not necessarily expected that all of the described advantages will be achieved with every embodiment of the invention.

The invention claimed is:

1. A composition comprising:
   a semiconductor substrate having a crystallographic plane oriented parallel to a surface of the substrate;
   at least one planar semiconductor nanowire epitaxially disposed on the substrate and aligned along a crystallographic direction of the substrate parallel to the crystallographic plane; and
   a metal nanoparticle in contact with an end of the planar semiconductor nanowire.

2. The composition of claim 1 comprising a plurality of planar semiconductor nanowires epitaxially disposed on the substrate and aligned in the crystallographic direction.

3. The composition of claim 1 wherein the crystallographic plane is selected from the {100} family of planes.

4. The composition of claim 3 wherein the crystallographic plane is a (001) plane, the semiconductor substrate being a (001) semiconductor substrate.

5. The composition of claim 1 wherein the crystallographic direction is a <110> direction.

6. The composition of claim 5 wherein the crystallographic direction is one of [-110] and [1-10].

7. The composition of claim 1 wherein the semiconductor substrate comprises a III-V semiconductor.

8. The composition of claim 7 wherein the III-V semiconductor comprises GaAs.

9. The composition of claim 1 wherein the planar semiconductor nanowire comprises a lateral dimension of from about 5 nm to about 250 nm.

10. The method of claim 1 wherein the nanoparticle comprises gold.

11. The composition of claim 1 wherein the planar semiconductor nanowire is epitaxially disposed on a sacrificial layer between the substrate and the nanowire, the sacrificial layer being epitaxially disposed on the substrate.

12. The composition of claim 1 wherein the planar semiconductor nanowire comprises a dopant.

13. The composition of claim 12 wherein the dopant is silicon.

14. The composition of claim 13 further comprising a source, a drain, and a gate in contact with the planar semiconductor nanowire, wherein a planar nanowire channel connects the source and the drain.

15. The composition of claim 14 wherein the planar nanowire channel comprises a trapezoidal cross section with two {111} sidewall facets and a {100} top facet.

16. The composition of claim 15 further comprising a tri-gate structure wherein a gate is in contact with each of the sidewall facets and the top facet.

17. A composition comprising:
   a semiconductor substrate having a crystallographic plane oriented parallel to a surface of the substrate; and
   at least one planar semiconductor nanowire epitaxially disposed on the substrate and aligned along a crystallographic direction of the substrate parallel to the crystallographic plane,
   wherein the semiconductor substrate and the planar semiconductor nanowire comprise the same semiconductor.

18. The composition of claim 17 comprising a plurality of planar semiconductor nanowires epitaxially disposed on the substrate and aligned in the crystallographic direction.

19. The composition of claim 17 wherein the crystallographic plane is selected from the {100} family of planes.

20. The composition of claim 17 wherein the crystallographic direction is a <110> direction.

21. The composition of claim 17 wherein the semiconductor substrate comprises a III-V semiconductor.

22. The composition of claim 21 wherein the III-V semiconductor comprises GaAs.

23. The composition of claim 17 wherein the planar semiconductor nanowire comprises a lateral dimension of from about 5 nm to about 250 nm.

24. The composition of claim 17 wherein the planar semiconductor nanowire is epitaxially disposed on a sacrificial layer between the substrate and the nanowire, the sacrificial layer being epitaxially disposed on the substrate.

25. The composition of claim 17 wherein the planar semiconductor nanowire comprises a dopant.

26. The composition of claim 25 wherein the dopant is silicon.

27. The composition of claim 26 further comprising a source, a drain, and a gate in contact with the planar semiconductor nanowire, wherein a planar nanowire channel connects the source and the drain.

28. The composition of claim 27 wherein the planar nanowire channel comprises a trapezoidal cross section with two {111} sidewall facets and a {100} top facet.

29. The composition of claim 28 further comprising a tri-gate structure wherein a gate is in contact with each of the sidewall facets and the top facet.

30. A composition comprising:
   a semiconductor substrate having a crystallographic plane oriented parallel to a surface of the substrate; and
   at least one planar semiconductor nanowire epitaxially disposed on the substrate and aligned along a crystallographic direction of the substrate parallel to the crystallographic plane,
   wherein the semiconductor substrate and the planar semiconductor nanowire comprise a III-V semiconductor.

31. The composition of claim 30 comprising a plurality of planar semiconductor nanowires epitaxially disposed on the substrate and aligned in the crystallographic direction.

32. The composition of claim 30 wherein the crystallographic plane is selected from the {100} family of planes.

33. The composition of claim 30 wherein the crystallographic direction is a <110> direction.

34. The composition of claim 30 wherein the III-V semiconductor comprises GaAs.

35. The composition of claim 30 wherein the planar semiconductor nanowire comprises a lateral dimension of from about 5 nm to about 250 nm.

36. The composition of claim 30 wherein the planar semiconductor nanowire is epitaxially disposed on a sacrificial layer between the substrate and the nanowire, the sacrificial layer being epitaxially disposed on the substrate.

37. The composition of claim 30 wherein the planar semiconductor nanowire comprises a dopant.

38. The composition of claim 37 wherein the dopant is silicon.

39. The composition of claim 38 further comprising a source, a drain, and a gate in contact with the planar semiconductor nanowire, wherein a planar nanowire channel connects the source and the drain.

40. The composition of claim 39 wherein the planar nanowire channel comprises a trapezoidal cross section with two {111} sidewall facets and a {100} top facet.

41. The composition of claim 40 further comprising a tri-gate structure wherein a gate is in contact with each of the sidewall facets and the top facet.

* * * * *